(12) United States Patent  
Spitzer et al.

(10) Patent No.: US 7,289,353 B2  
(45) Date of Patent: Oct. 30, 2007

(54) SYSTEMS AND METHODS FOR ADJUSTING PROGRAMMING THRESHOLDS OF POLYMER MEMORY CELLS

(75) Inventors: Stuart Spitzer, Lynnfield, MA (US); Juri H Krieger, Brookline, MA (US); David Gaun, Brookline, MA (US)

(73) Assignee: Spansion, LLC, Sunnyvale, CA (US)

( * ) Notice: Subject to any disclaimer, the term of this patent is extended or adjusted under 35 U.S.C. 154(b) by 181 days.

(21) Appl. No.: 10/919,846

(22) Filed: Aug. 17, 2004

(65) Prior Publication Data

US 2006/0038982 A1 Feb. 23, 2006

(51) Int. Cl.  
*G11C 11/00* (2006.01)  
*G11C 11/34* (2006.01)

(52) U.S. Cl. ............ 365/151; 365/185.18; 365/185.19; 365/185.29

(58) Field of Classification Search ................ 365/151, 365/158, 171, 173, 185.18, 185.19, 185.24, 365/185.29  
See application file for complete search history.

(56) References Cited

U.S. PATENT DOCUMENTS

| 6,781,868 B2 * | 8/2004 | Bulovic et al. ............. 365/151 |
| 6,809,955 B2 * | 10/2004 | Bulovic et al. ............. 365/151 |
| 6,873,540 B2 * | 3/2005 | Krieger et al. ............. 365/151 |
| 2002/0163831 A1 | 11/2002 | Krieger et al. |
| 2003/0155602 A1 | 8/2003 | Krieger et al. |
| 2003/0173612 A1 | 9/2003 | Krieger et al. |
| 2004/0026714 A1 | 2/2004 | Krieger et al. |
| 2004/0102038 A1 | 5/2004 | Oglesby |

FOREIGN PATENT DOCUMENTS

| WO | WO 03/017282 A | 2/2003 |
| WO | WO 2004/102579 A | 11/2004 |

OTHER PUBLICATIONS

International Search Report dated Nov. 22, 2005 mailed Nov. 29, 2005 for PCT Application Ser. No. PCT/US2005/028338, 4 Pages.  
Krieger, et al, "Non-Traditional, Non-volatile Memory Based on Switching and Retention Phenomena in Polymeric Thin Films", Non-volatile Memory Technology Symposium, Nov. 15, 2004, pp. 121-124.

\* cited by examiner

*Primary Examiner*—Trong Phan  
(74) *Attorney, Agent, or Firm*—Amin, Turocy & Calvin, LLP

(57) ABSTRACT

Systems and methodologies are provided for adjusting threshold associated with a polymer memory cell's operation by applying thereupon a regulated electric field and/or voltage pulse width, during a post fabrication stage. Such customization of programming thresholds can typically be obtained at any cycle of programming the memory cell, to increase flexibility in circuit design. Accordingly, the present invention supplies both a current-voltage domain, and/or a frequency-time domain, to facilitate adjusting the program thresholds of the polymer memory cell.

12 Claims, 11 Drawing Sheets

SYSTEMS AND METHODS FOR ADJUSTING PROGRAMMING THRESHOLDS OF POLYMER MEMORY CELLS

TECHNICAL FIELD

The present invention relates generally to customizing programming threshold values in polymer memory cells, and in particular to setting and/or adjusting write and erase voltage thresholds of polymer memory cells at a post fabrication stage to program speed at which such polymer memory cells change state.

BACKGROUND OF THE INVENTION

The proliferation and increased usage of portable computer and electronic devices has greatly increased demand for memory cells. Digital cameras, digital audio players, personal digital assistants, and other electronic devices generally seek to employ large capacity memory cells (e.g., flash memory, smart media, compact flash, or the like). Such memory cells can be typically employed in various types of storage devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums.

Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Accordingly, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). Typically, for volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices.

Because of the increasing demand for information storage, memory device developers and manufacturers are constantly attempting to increase speed and storage retrieval for memory devices (e.g., increase write/read speed). Nonetheless, in general for such memory cells a programming threshold for operation is fixed, and the circuits are being designed around such permanent and unchanging values. At the same time, silicon-based devices are approaching their fundamental physical size limits. Moreover, inorganic solid state devices are generally encumbered with a complex architecture which leads to high cost and a loss of data storage density. Therefore, there is a need to overcome the aforementioned deficiencies associated with conventional systems

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provides for systems and methods of customizing various programming thresholds for polymer memory cells, by applying thereupon a regulated electric field and/or voltage pulse width at a post fabrication stage. Accordingly, a user's preference for a particular programming threshold can be obtained at a desired cycle of programming the memory cell. Such customization can increase flexibility in circuit design by, for example, balancing memory speed with power consumption to obtain optimum performance. The programming threshold values can for example designate a limit associated with a particular programming state for the polymer memory cell, wherein the device changes from an "off" state to an "on" state.

According to one aspect of the present invention, a write programming voltage can be set to a desired value based on regulating a voltage applied beyond an erase threshold associated with the polymer memory cell. The write voltage for the next programming cycle of the polymer memory cell can generally vary as a direct proportional linear function of the difference in voltage over the erase threshold of the polymer memory cell. Accordingly, by varying the voltage applied beyond the erase threshold, (e.g., to a range of −10 volts), desired threshold write voltages can be obtained to satisfy circuit requirements. For example, increasing a voltage applied beyond the erase threshold can increase the voltage required for programming the memory cell during a subsequent programming cycle.

In another aspect of the present invention, employing a variable pulse width enables establishing a range of program voltage thresholds, which typically varies as an inverse function of the variable pulse. Accordingly, a desired write voltage can be adjusted, and the polymer memory cell switched from an "off" state to an "on state" at a predetermined value, based on setting the pulse width of the programming clock. Thus, the present methodology can establish a frequency dependent write voltage, and system designers can balance memory speed with power supply voltage to obtain optimum performance in circuit design. Both a current-voltage domain and a frequency-time domain can affect adjusting program thresholds associated with a polymer memory cell.

In a related aspect of the present invention an erase threshold voltage for a polymer memory cell can also be customized by employing a variable pulse width to set desired erase threshold in a manner desired by circuit designer. The erase voltage threshold can vary inversely with the pulse width, and allows setting the erase voltage of the polymer memory cell to desired values.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings. To facilitate the reading of the drawings, some of the drawings may not have been drawn to scale from one figure to another or within a given figure.

DETAILED DESCRIPTION OF THE INVENTION

Figure 1:
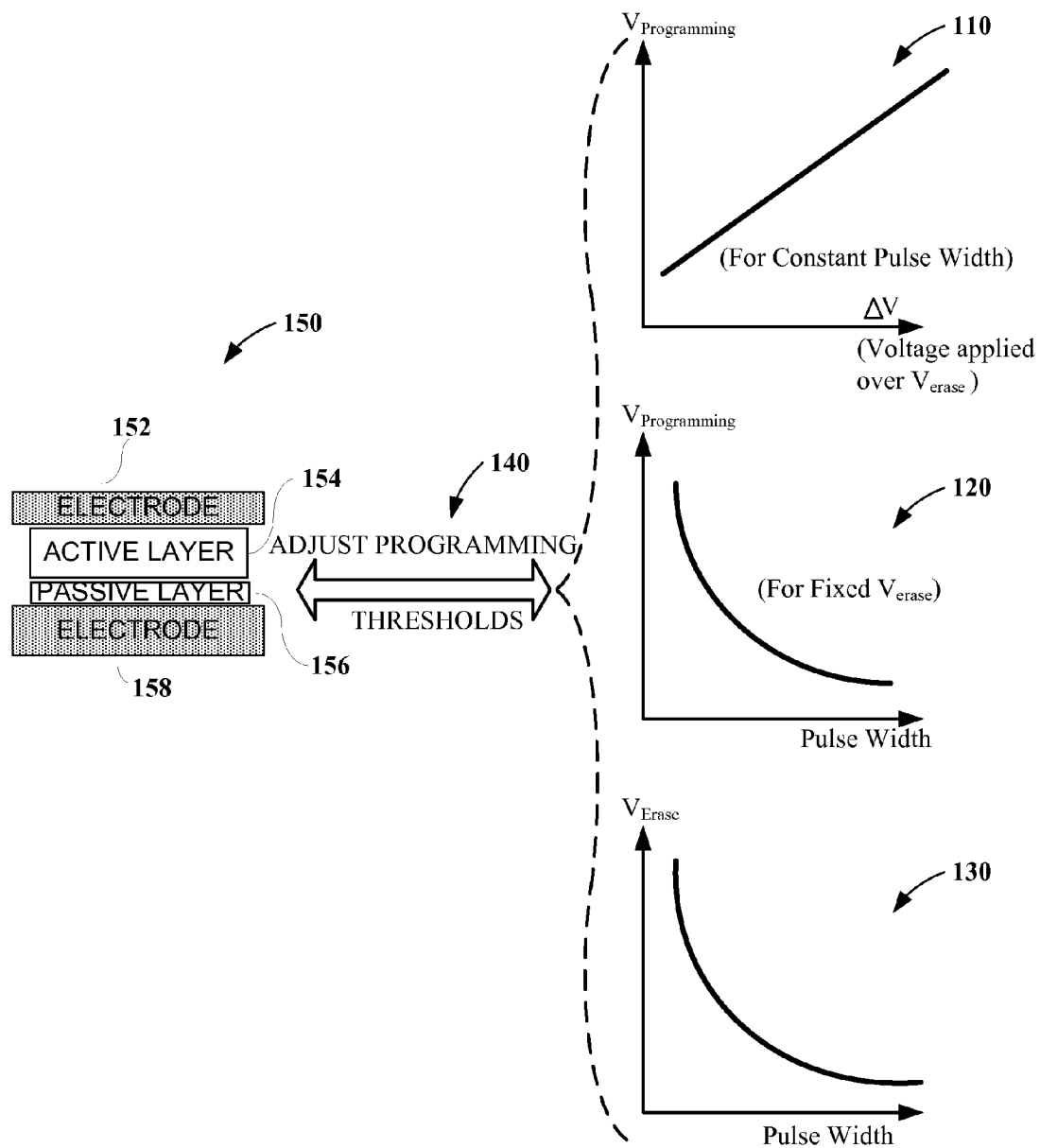
FIG. 1 illustrates a schematic diagram for customizing the programming threshold values of a polymer memory cell based on three different methodologies.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention provides for systems and methods of customizing various programming thresholds of a polymer memory cell by subjecting it to a regulated electric field (e.g., controlled voltage), and/or pulse width during a post fabrication stage. Referring initially to FIG. 1, schematic graphs are depicted for illustrating the relation between programming voltage thresholds and the controlled parameters within an exemplary polymer memory cell according to one aspect of the present invention. The exemplary polymer memory device 150 can comprise an active layer 154 and a passive layer 156 residing between two electrodes 152 and 158. Graph 110 illustrates typically a linear relation, for a constant pulse width, between the write threshold ($V_{programming}$) and the voltage ($\Delta V$) that is applied in an erase direction (as further described infra) passed the erase threshold ($V_{erase}$) of the memory cell. Based on the amount of voltage applied to the polymer memory cell beyond the erase threshold, a write threshold can be determined for the next cycle of programming the memory cell. Typically, the voltage applied to the memory cell can be in a range of ±10 volts. Accordingly, the further in the erase direction a voltage is applied to the memory cell (e.g., the "harder" the erase reached), then the higher is the programming voltage required for the next cycle of the polymer memory cell.

Graph 120 illustrates a related relationship between the programming voltage and the pulse width (e.g., a programming clock) of the write voltage, according to one aspect of the present invention. In this illustration, the $V_{erase}$ is fixed. As illustrated a range of program voltage thresholds can be established by varying a pulse width, such that programming thresholds can be adjusted 140 at typically any stage of programming the polymer memory cell. As the pulse width increases, an associated programming threshold decreases to an asymptotic value that can represent a programming via a typical direct current.

A similar hyperbolic relation exists between the pulse width and the erase threshold of a memory cell. Graph 130 represents changes of an erase threshold voltage for a polymer memory cell as a function of a variable pulse width, wherein the erase threshold is adjustable in a manner desired by circuit designer at typically any stage of programming the polymer memory cell, by selecting a suitable pulse width at a corresponding voltage. The erase voltage threshold can vary as a hyperbolic function of the pulse width, and allows setting the erase voltage of the polymer memory cell to desired values.

Figure 2:
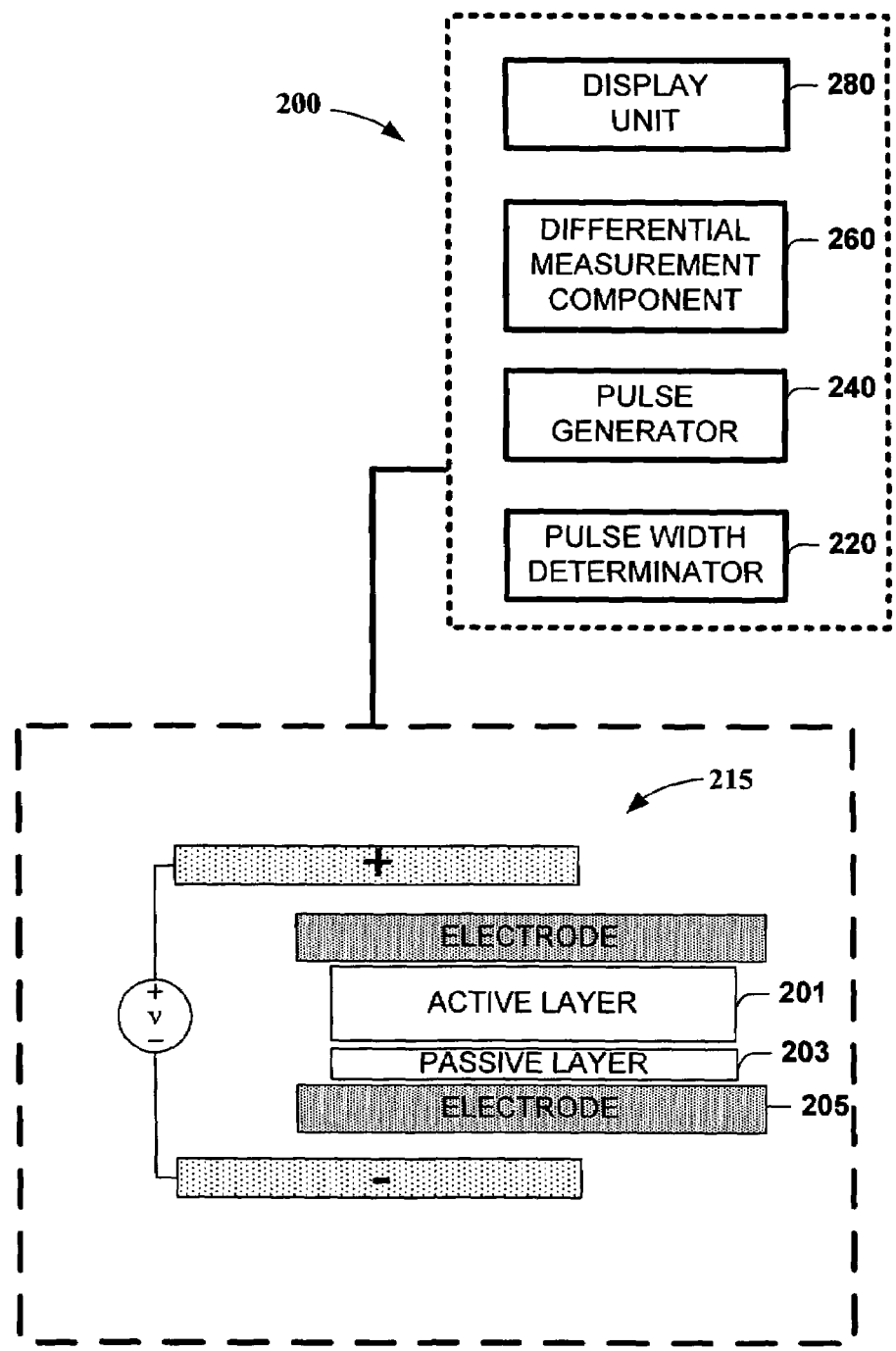
FIG. 2 illustrates a block diagram for a system that can adjust programming thresholds of a polymer memory cell (s), in accordance with an exemplary aspect of the present invention.

FIG. 2 depicts a schematic diagram of a polymer memory cell 215 having associated programming thresholds set based on system 200 according to one aspect of the present invention. Typically, if the lower electrode 205 is a copper electrode an erase direction for such memory cell can be defined as applying a negative voltage to its copper electrode. Like wise, a programming direction for the memory cell with a lower copper electrode can be defined as applying a positive voltage to the copper electrode. The programming threshold adjustor system 200 can comprise: a pulse width determinator 220, a pulse generator 240, (e.g., triangular, square pulse, or combination mode wave generators), differential voltage/current measurement components 260 with sense amplifiers, and a display 280 that can monitor various control parameters (e.g., voltage, current, pulse width and the like) as part of setting the program threshold of the polymer memory cell 215. In addition, the polymer memory cell 215 can be part of an array formed on a silicon based wafer, and can include a plurality of rows (not shown) referred to as bit lines and a plurality of columns (not shown) referred to as wordlines. The intersection of a bit line and a word line constitutes the address of a particular memory cell, which can have a programming voltage adjusted via the system 200.

The polymer memory cell 215 can include an active layer 201 and a passive layer 203 that can be deposited over a conducting layer 205. The active layer 201 can change an impedance state (e.g., from a high resistance to a low resistance) when subject to a stimulus such as a voltage or current. An active molecule or molecular group forming the active layer can be one that changes a property when subjected to an electrical field and/or light radiation, (e.g., ionizable group); such as: nitro group, amino group, cyclopentadienyl, dithiolane, methlcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, aminobenzoate, and molecular units with redox-active metals; metallocenes (Fe, V, Cr, Co, Ni and the like) complex, polypyridine metal complex (Ru, Os and the like).

In a related aspect, the active layer 201 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiophene, poly(siliconoxohemiporphyrazine), poly(germaniumoxohemiporphyrazine), poly(ethylenedioxythiophene), polyfluorene, polyphenylacetylene, polydiphenylacetylene and related derivatives with active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraaza-tetramethylannulene and so on); porphyrin, phthalocyanine, hexadecafluoro phthalocyanine and their derivatives with active molecular group.

In a further aspect of the present invention, the active layer can comprise; polymer polyphenylacetylene+molecules of chloranil or tetracyano-quinodimethane or dichlordicyanoquinone, copper phthalocyanine (which can be deposited by thermal deposition method to about 30 Å-1000 Å); copper hexadecafluoro phthalocyanine, amorphous carbon or palladium, (which can be deposited on the upper surface of the active layer by magnetron co-sputtering); and polysilanes with N-carbazolylpropyl group; polymer polytiophene with cyclopentadienyl groups; polysilanes with cyclopentadienyl groups; polysilanes with amino groups; polythiophene with alkyl amino groups; polythiophene with cyclopentadienyl alkyl groups; composite containing polydiphenylacetylene containing carbazolyl groups and dinitro-n-phenyl (DNP); polyethylenedioxythiophene and porous ferroelectric (polyvinyline fluoride) containing $LiCF_3$ $SO_3$ salt, polyethylenedioxythiophene and salt of potassium hexycyanoferrate.

As depicted in FIG. 2, the active layer 201 can be formed over the passive layer 203 on top of a conductive layer 205, to fabricate layers of a polymer memory cell. The active layer 201 can be fabricated via a number of suitable techniques. One such technique involves growing the active layer 201 in the form of an organic layer from the passive layer 203. During such growth a quantity of material from conductive substrate can become incorporated into the active layer, for example in the form of metal ions (e.g., 2-12% copper concentrations) being chemically bound or trapped in the active layer 201. Likewise, spin-on techniques can be employed for such fabrication. Moreover, chemical vapor deposition (CVD) techniques can also be employed. Typically, CVD can include low pressure chemical vapor deposition (LPCVD), atmospheric pressure CVD (APCVD), plasma enhanced chemical vapor deposition (PECVD), and high density chemical vapor deposition (HDCVD).

In a related aspect of the present invention, the active layer 201 can also be comprised of a conjugated organic material, such as a small organic molecule and a conjugated polymer. If the organic layer is polymer, a polymer backbone of the conjugated organic polymer can extend lengthwise between conducting layer 205 and a top conducting electrode placed on the active layer after (e.g., generally substantially perpendicular to the inner, facing surfaces of the conducting layer 205). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials facilitates control of properties associated with the memory cell fabricated from such layers. In this connection, the conjugated organic material of the active layer 201 has the ability to donate and accept charges (holes and/or electrons), and trap ions. Generally, the conjugated organic molecule has at least two relatively stable oxidation-reduction states. The two relatively stable states permit the conjugated organic polymer to donate and accept charges, when interacting with the passive (superionic) layer. Moreover when employing CVD techniques, it is not generally necessary to functionalize one or more ends of the organic molecule in order to attach it to the passive layer 203. Sometimes such organic molecules can have a chemical bond formed between the conjugated organic polymer of the active layer 201 and the passive layer 203.

In one particular aspect of the present invention, the organic material employed as part of the active layer 201 can be cyclic or acyclic. For some cases, such as organic polymers, the organic material can self assemble during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

Such organic material, which in one exemplary aspect can form the active layer 201, has a suitable thickness that depends upon the chosen implementations of the memory cell being fabricated. Some suitable exemplary ranges of thickness for the organic polymer layer, which in part can form the active layer 201, are about 10 nm or more and about 200 nm or less. Similarly, the passive layer 203 can have a suitable thickness that can vary based on the implementation of the memory cell being fabricated. Some examples of suitable thicknesses for the passive layer 203 can be: a thickness of about 5 nm or more and about 200 nm or less.

According to one aspect of the present invention, the passive layer can be selectively grown, spun-on, deposited upon the conducting layer 205 via CVD, vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

Additionally, the passive layer 203 facilitates metal ion injection into the active layer 201 and increases the concentration of metal ions in the active layer 201 that can modify the conductivity of the active layer 201.

The passive layer 203 contains at least one conductivity facilitating compound that has the ability to donate and accept ions. Generally, the conductivity facilitating compound has at least two relatively stable oxidation-reduction states that can permit the conductivity facilitating compound to donate and accept ions. Examples of other conductivity facilitating compounds that can be employed for the passive layer 203 include one or more of the following: tungsten oxide ($WO_3$), molybdenum oxide ($MoO_3$), titanium selenide ($TiSe_2$), one or more of copper sulfide ($Cu_2S$, $CuS$), copper oxide ($CuO$, $Cu_2O$), manganese oxide ($MnO_2$), titanium dioxide ($TiO_2$), indium oxide ($I_3O_4$), silver sulfide ($Ag_2S$), iron oxide ($Fe_3O_4$), and the like. The passive layer 203 may be grown using oxidation techniques, formed via gas phase reactions, or deposited between conducting electrodes of a polymer memory cell. It is to be appreciated that the invention is not so limited and other conducting and/or semi conducting materials can also be employed. The passive layer 203 has a suitable thickness that can vary based on the implementation and/or memory device being fabricated. The passive layer 203 can in some instances act as a catalyst when forming the active layer 201. In this connection, a backbone of a conjugated organic molecule can initially form adjacent the passive layer 203, and grow or assemble away and substantially perpendicular to the passive layer surface. As a result, the backbones of the conjugated organic molecule can be self aligned in a direction that traverses the conducting layer 205 (e.g., copper electrode) The passive layer 203 can be formed by a deposition process (e.g., thermal deposition, PVD, non-selective CVD, and the like) or by a complete sulfidation of pre-deposited thin Cu layer.

Figure 3:
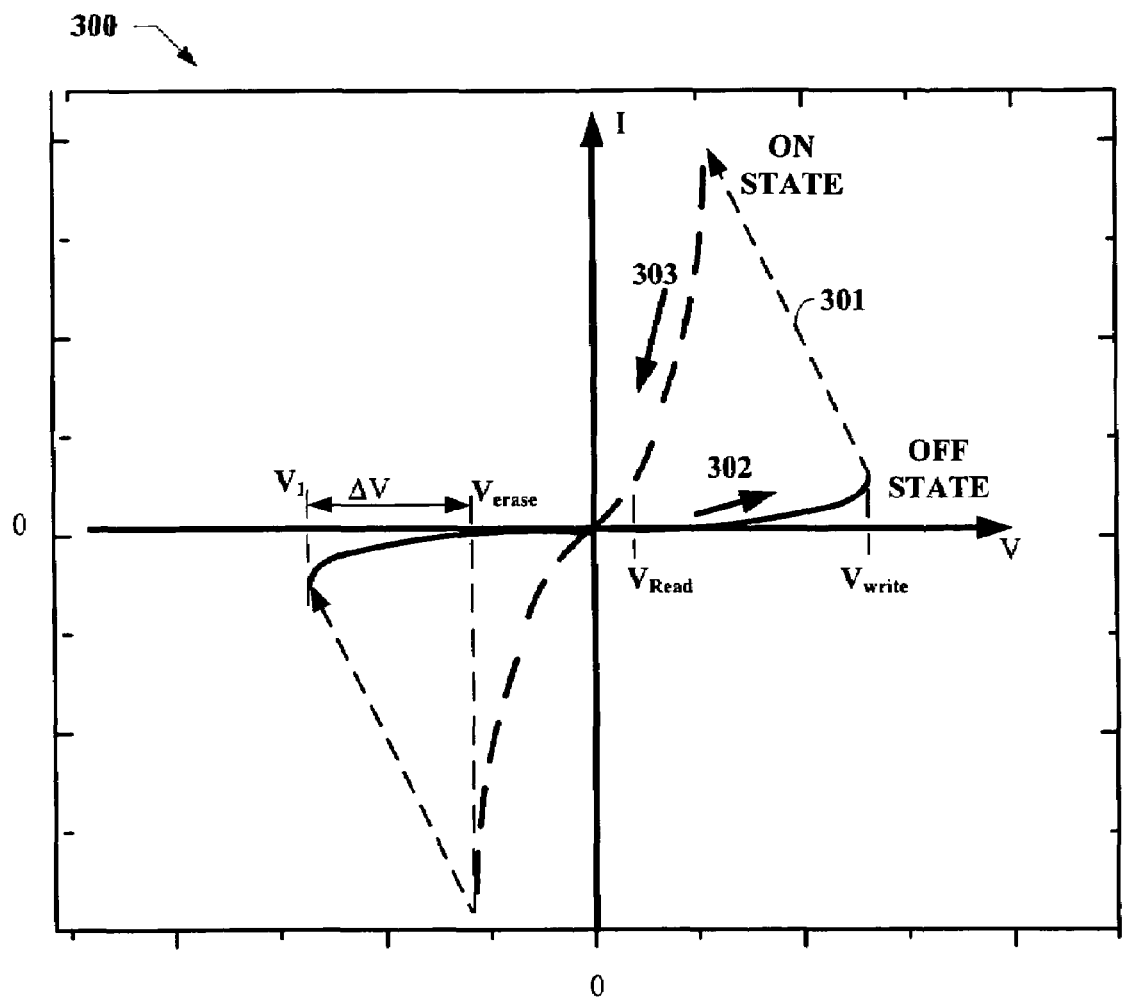
FIG. 3 is a graph illustrating I-V characteristics for a particular polymer memory cell with adjustable programming thresholds according to one aspect of the present invention.

FIG. 3 illustrates an exemplary current-voltage graph 300 for a polymer memory cell having a lower copper bottom electrode, during "On" and "Off" states. As explained earlier for such electrode an erase direction can be defined as applying a negative voltage to the lower copper electrode, and a programming direction can be defined as applying a positive voltage to the lower copper electrode. As illustrated, an arbitrary current requires a higher voltage for an "OFF" state, when compared to an "On" state. The "On" and "Off" states can be distinguished by choosing a current and measuring a respective voltage and vice versa. The memory cell can exhibit an I-V graph that is symmetrical with respect to the point of origin. As illustrated, slope of line 301 typically reflects the current limiting resistance of the circuit (e.g., reflecting a load line that can be varied by a combination of the applied voltage and a resistance in series with the memory component.) Such line depicts a typically transitional state when switching the device. $V_{read}$ represents the voltage required to read the state of the polymer memory cell.

If the voltage is increased in a direction of the arrow 302 by tracing the "OFF" state (solid curve) such that the a write voltage threshold ($V_{write}$) is obtained, the memory cell then switches from an "OFF" state of low resistance to an "ON" state of high resistance. The value of such $V_{write}$ for the very next cycle of programming can be customized, based on a voltage applied in an erase direction beyond the erase threshold, for example to a level $V_1 = V_{erase} + \Delta V$. The write voltage for the next programming cycle of the polymer memory cell can generally vary as a direct proportional linear function of the difference in voltage over the erase threshold ($\Delta V$).

As illustrated upon reaching an ON state, a decrease of voltage traces in a direction of arrow 303 into negative voltage values following a path of the ON state (dashed curve.) Thereafter, an erase voltage threshold point ($V_{erase}$) can be obtained that can then switch the device from an "ON" state to an "OFF" state as depicted by arrow 304. Nonetheless, if before reaching such erase threshold voltage the voltage is reversed the I-V trace-will retrace back on the "ON" state curve in a direction opposite the arrow 303. If the erase threshold is surpassed in the negative voltage direction, any voltage reversal typically will follow the "OFF" state curve, and the corresponding threshold write voltage will be increased for the next programming cycle. Accordingly, by varying the voltage applied beyond the erase threshold, (e.g., to a range of −10 volts), desired threshold write voltages can be obtained to satisfy circuit requirements, wherein the further in the erase direction a voltage is applied to the memory cell (e.g., the "harder" the erase reached), then the higher is the programming voltage required for the next cycle of the polymer memory cell. Such customization can increase flexibility in circuit design, and enables design of circuits according to a user's preference.

Figure 4:
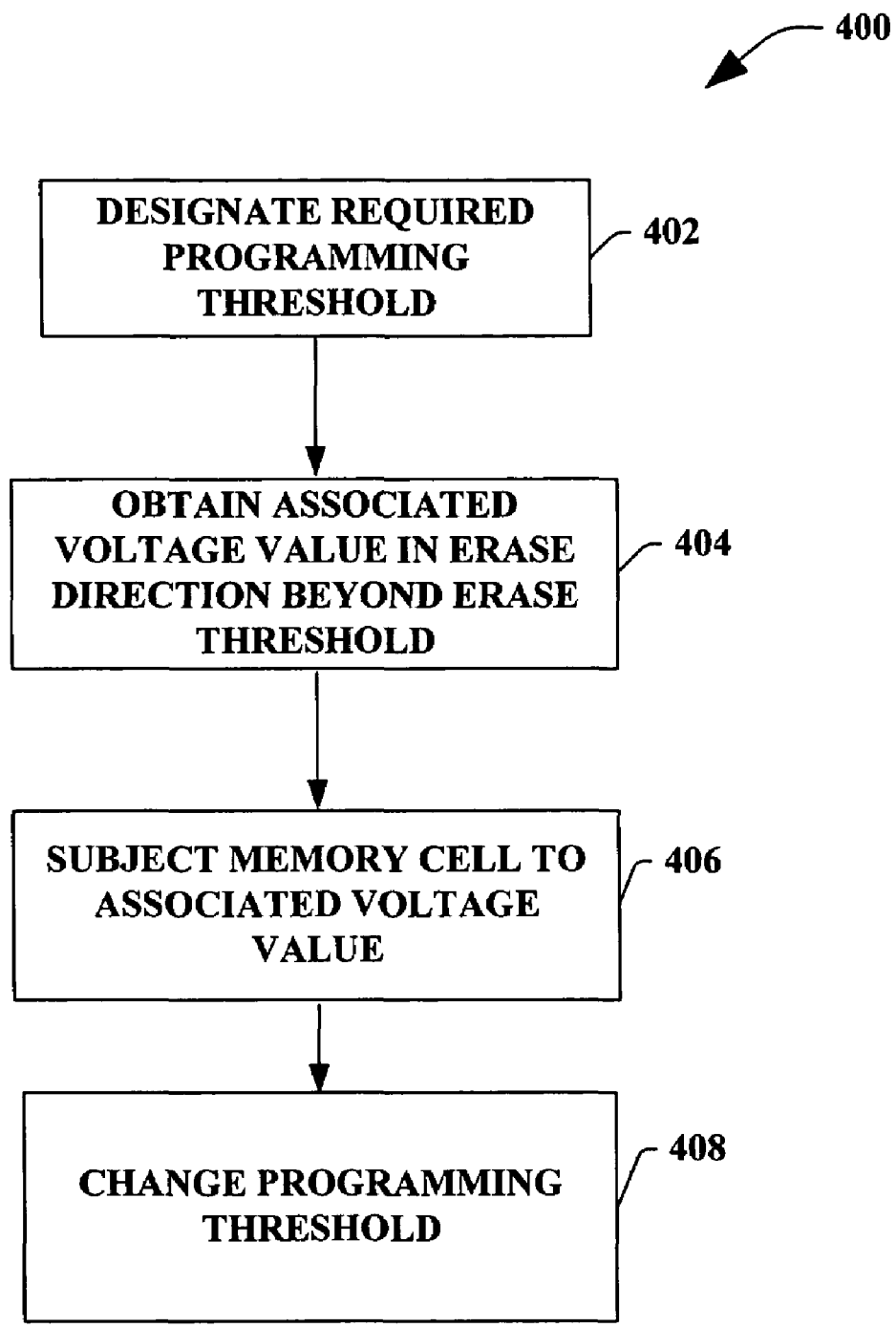
FIG. 4 illustrates another exemplary methodology for setting a programming threshold of a memory cell by employing a voltage beyond an erase threshold in accordance with an aspect of the present invention.

FIG. 4 illustrates a related methodology 400 according to one aspect of the present invention. Initially, and at 402 a desired programming threshold ($V_{write}$) is designated based on a user's preference or specific requirements for a circuit. Subsequently, and at 404 a voltage value required in excess of the existing erase threshold for the polymer memory cell is calculated or obtained via a graph that depicts the desired programming threshold as a function of the voltage value. According to one aspect of the present invention, the write voltage for the next programming cycle of the polymer memory cell can generally vary as a direct proportional linear function of the difference in voltage over the erase threshold. Subsequently and at 406 the polymer memory cell is subjected to such corresponding voltage difference over the erase threshold, and the desired write threshold obtained at 408. It is to be appreciated that FIG. 4 is illustrative of a current-voltage methodology based on a particular programming frequency, and that both a current-voltage domain as well as a frequency/time domain can affect program thresholds associated with a polymer memory cell.

Figure 5:
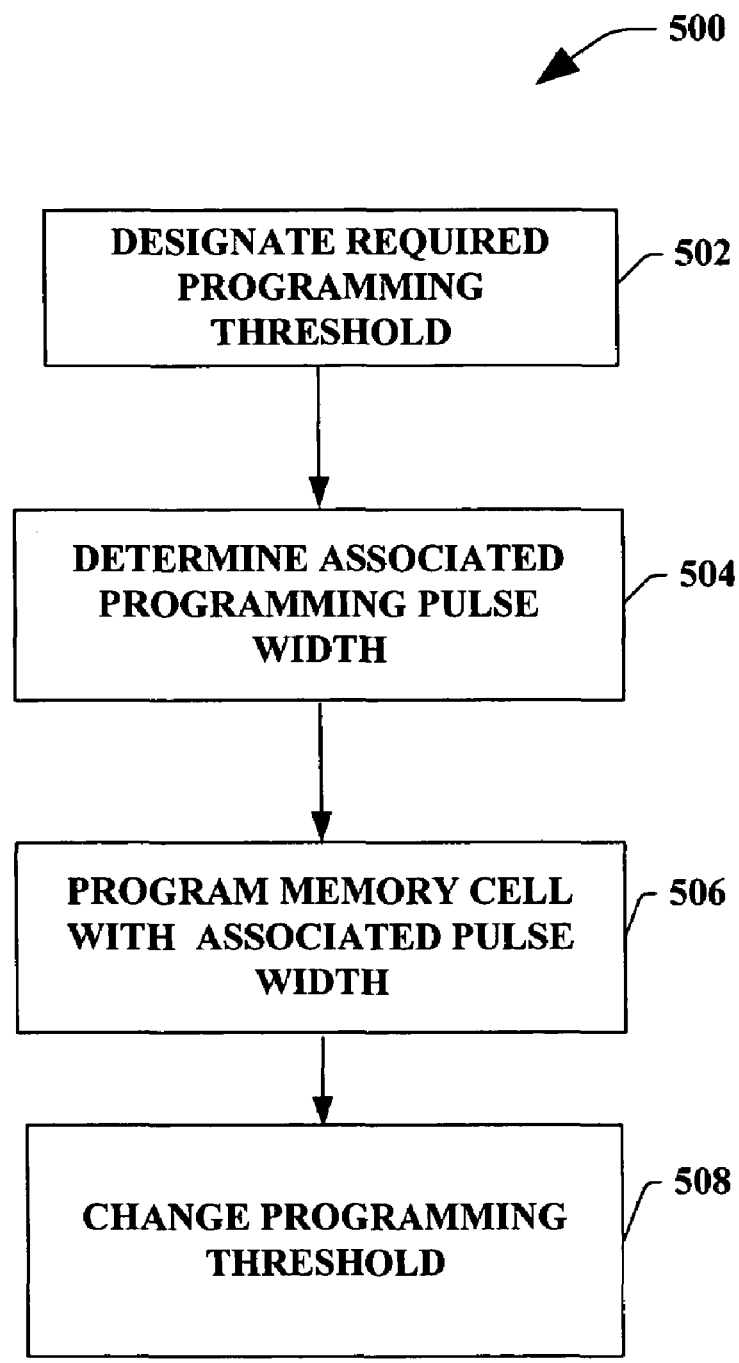
FIG. 5 illustrates a further exemplary methodology for setting a programming threshold of a memory cell via a pulse width variation in accordance with an aspect of the present invention.

FIG. 5 illustrates a related methodology 500 employing a frequency/time domain according to another aspect of the present invention, wherein a variable pulse width enables establishing a range of program voltage thresholds, which typically vary as a hyperbolic function of the variable pulse. Initially, and at 502 a desired programming threshold ($V_{write}$) is designated based on a user's preference or specific requirements for a circuit. Subsequently, and at 504 an associated pulse width is calculated or obtained via a graph that depicts the pulse width as a function of the desired programming threshold. Once this pulse width is determined, at 506 the memory cell is programmed with this pulse width, and subsequently, at 508, the programming threshold of the memory cell is changed. According to one aspect of the present invention, the program voltage thresholds typically vary as a hyperbolic function of the variable pulse. Accordingly, a desired write voltage can be adjusted, and the polymer memory cell switched from an "off" state to an "on state" at a predetermined value, based on setting the pulse width of the programming clock. Thus, the present methodology can establish a frequency dependent write voltage, and system designers can balance memory speed with power supply voltage to obtain optimum performance in circuit design. In a related aspect of the present invention an erase threshold voltage for the polymer memory cell can also be customized by a variable pulse width in a manner desired by circuit designer. The erase voltage threshold can vary as a hyperbolic function of the pulse width, and allows setting the erase voltage of the polymer memory cell to desired values.

Figure 6:
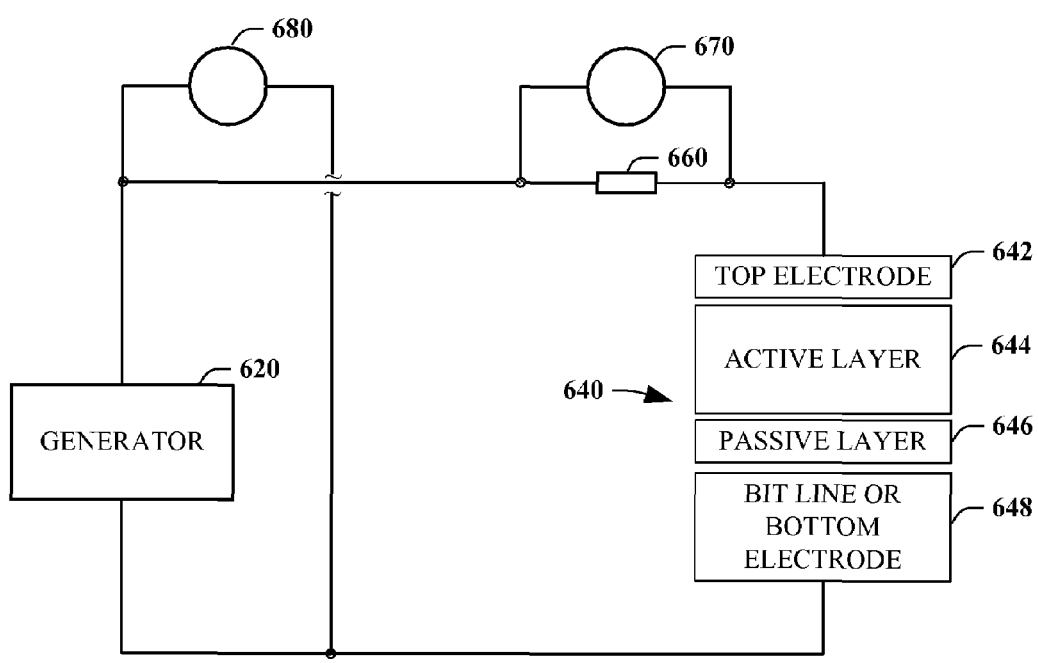
FIG. 6 illustrates a programming circuit for programming a memory having adjustable programming thresholds in accordance with an aspect of the present invention.

Referring now to FIG. 6 a circuit that programs a memory cell 640 having adjustable program thresholds is illustrated. The memory cell 640, in one embodiment, can comprise and active layer 644 and a passive layer 646, which reside between a top electrode 642 and a bit line or bottom electrode 648. The control system for programming the memory cell 640 includes a generator 620 that can provide a controllable electrical current level (e.g. a programmable current) during information writing and/or recording of the memory cell 640. The memory cell 640 includes two electrodes that sandwich various passive and active layers therebetween. It is to be appreciated that the present invention is not so limited and other layers such as various barrier layers can also be employed.

A ballast resistor 660 is operatively connected to the memory cell 640, and has a resistance designed to limit the maximum current flowing through the memory cell 640. Registering devices 670 and 680 can monitor circuit conditions during various programming stages of the memory cell 640. For example, the value of the current flowing through the memory cell can be obtained by measuring voltage on the ballast resistor 660, and such registering device can include voltmeters, oscillographs, recorders and other devices employed for monitoring circuit conditions at any moment.

Figure 7:
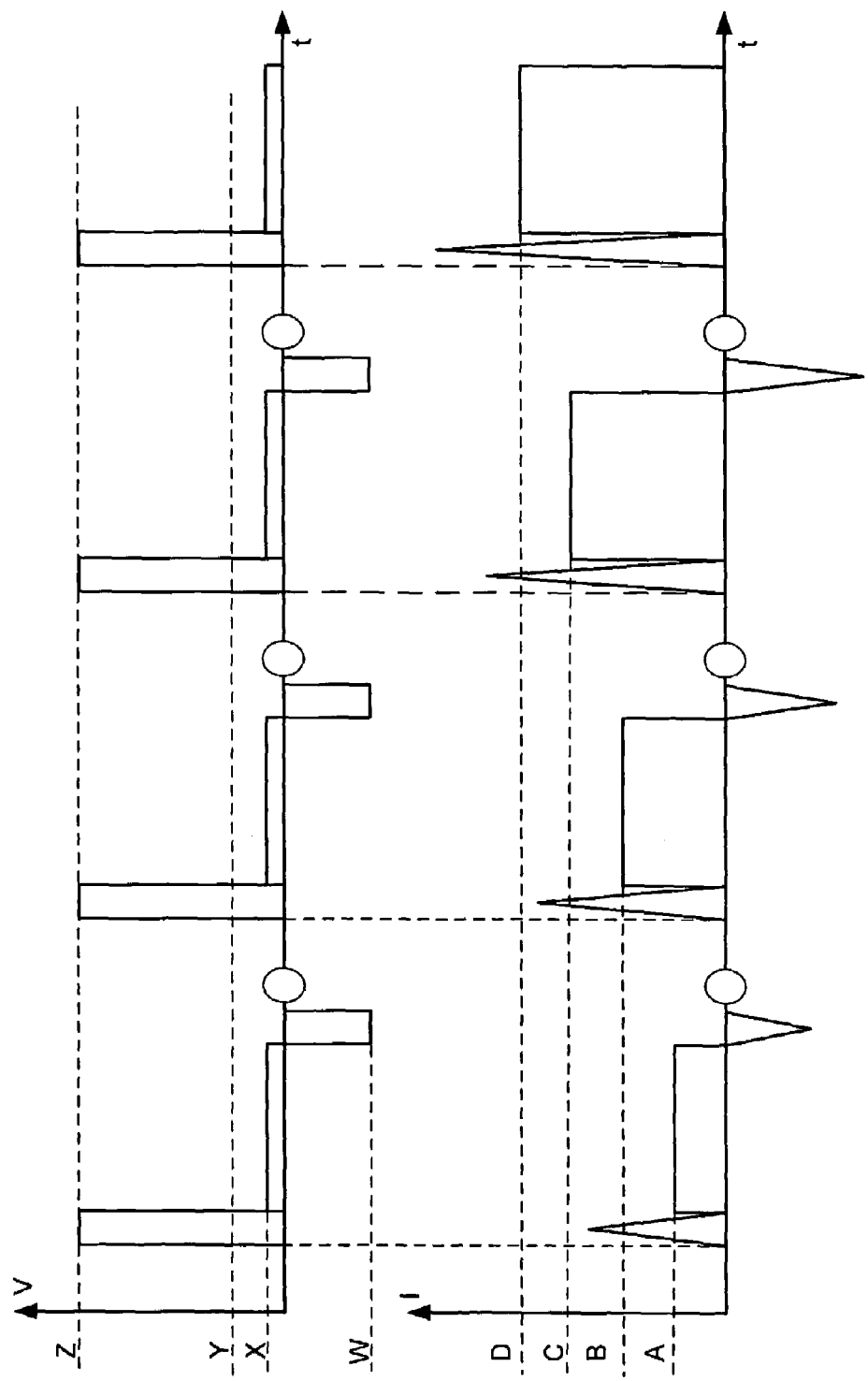
FIG. 7 illustrates graphs associated with voltage-time and current-time for various programming states of a memory cell according to one aspect of the present invention.

According to one particular methodology of the present invention, the generator 620 forms an initial voltage pulse that exceeds a threshold reference (e.g. voltage value) required for programming a memory cell. For example, FIG. 7 illustrates associated voltage-time and current-time graphs of such a methodology for writing a two bit memory cell operation. Voltage levels "Z" and "Y" depict an initial voltage pulse and a threshold voltage respectively. The values of the current flowing through the memory cell 640 can then be obtained by measuring voltage on the ballast resistor 660. As such, current flowing through the memory cell can be controlled such that the various electric current pulse states correspond to respective bits of information, written in to the memory cell. For example and as depicted in FIG. 7; electric current level "A" can designate a value "00", electric current level "B" can designate a value "01", electric current level "C" can designate a value "10", and electric current level "D" can designate the value "11", all which are programmable into the memory cell 640.

Next, and after the electric current pulse reaches the desired programmed state, the write programming is complete, and the programming voltage switched off. Similarly, to read bits of information from the memory cell 640, a reading voltage "X" that is lower than the threshold voltage value "Y" is generated via the generator 620. Based on the amount of current flowing through the ballast resistor 660 of FIG. 6, and the reading voltage "X", the resistance of the memory cell 640 can then be calculated. Such electric current can then correspond to a reference electric current, to verify a programmed state of the memory cell. Likewise, to erase information, the generator 620 creates a negative voltage pulse W, which can create a current, controlled to reach an erase threshold value flowing through the memory cell. It is to be appreciated that other properties besides voltage, current, or impedance can be employed to program a memory cell having a functioning zone. For example, the controlled value can be an intensity of light (optical programming when light sensor/emitter layers are employed), or amount of time that the memory cell is subject to an external stimulus and/or signal. Such can also depend upon the structure of a particular memory cell, and material employed in its fabrication, as for the particular memory structure illustrated by FIG. 6, it may be necessary to return the cell to its initial state and erase recorded information before a further write operation can be performed.

Figure 8:
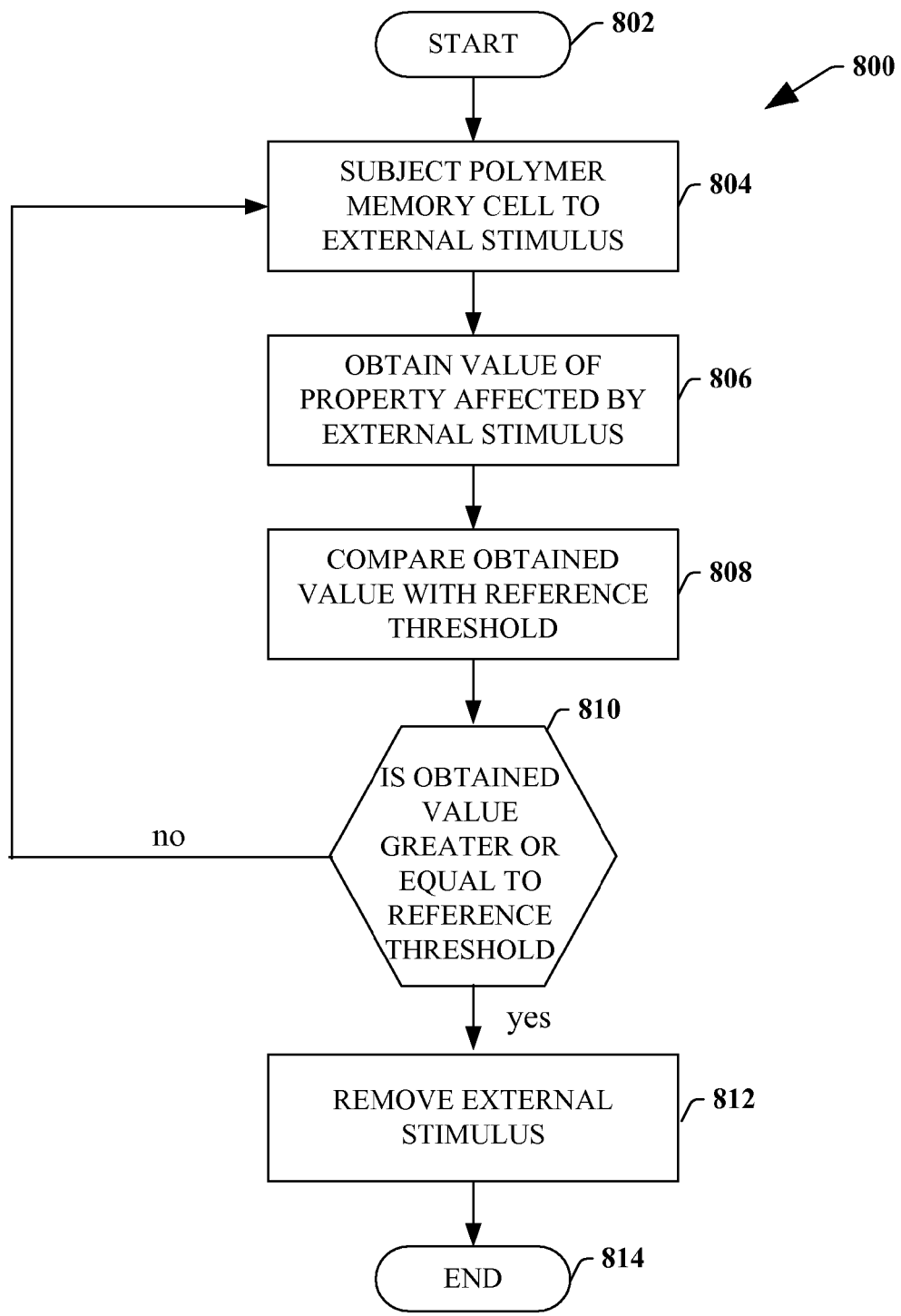
FIG. 8 illustrates an exemplary methodology for programming a memory cell in accordance with an aspect of the present invention.

Turning to FIG. 8, a flow diagram illustrates a methodology 800 for programming a memory cell according to one or more aspects of the present invention. The methodology begins at 802 where general initializations are performed. Such initializations can include, but are not limited to, establishing pointers, allocating memory, setting variables, establishing communication channels and the like. At 804, the polymer memory cell to be programmed receives an external stimulus. Such an external stimulus can be supplied via a control component, and can change an electrical and/or optical property(ies) associated with the polymer memory cell. The control component can further monitor/regulate the external stimulus, and thereby control the influenced property of the polymer memory cell. At 808, the value of property thus affected can be obtained (e.g. calculated and/or measured). Subsequently at 808, the obtained value is compared (e.g. via a comparator of the control system) to a reference threshold determined for that particular property. Such reference threshold can set an upper limit associated with a particular programming state for the polymer memory cell to be programmed. It is to be appreciated that other electrical/optical features that are dependent on the affected property can also be compared to respective predetermined values, and employed as reference criteria for verifying the program state.

Next, the process progresses to comparing step 810, if the value of the affected property exceeds or is equal to the reference threshold, then programming for such state is considered complete. The method then removes the external stimulus at 812, and ends at 814. Otherwise, the program returns to subjecting the memory cell to a new stimulus. It is to be appreciated that the reference threshold can set a lower limit associated with a particular programming state. Moreover, the threshold reference can also constitute a range, and the comparison step verifying whether the affected property of the polymer memory cell falls within the range or not.

While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. For example, the polymer memory cell can be subject to a stimulus that facilitates reading bits of information, as opposed to writing or erasing. In addition, not all illustrated blocks, events or acts, may be required to implement a methodology in accordance with the present invention. Moreover, it will be appreciated that the exemplary method and other methods according to the invention may be implemented in association with programming the polymer memory cell illustrated and described herein, as well as in association with other systems and apparatus not illustrated or described.

Figure 9:
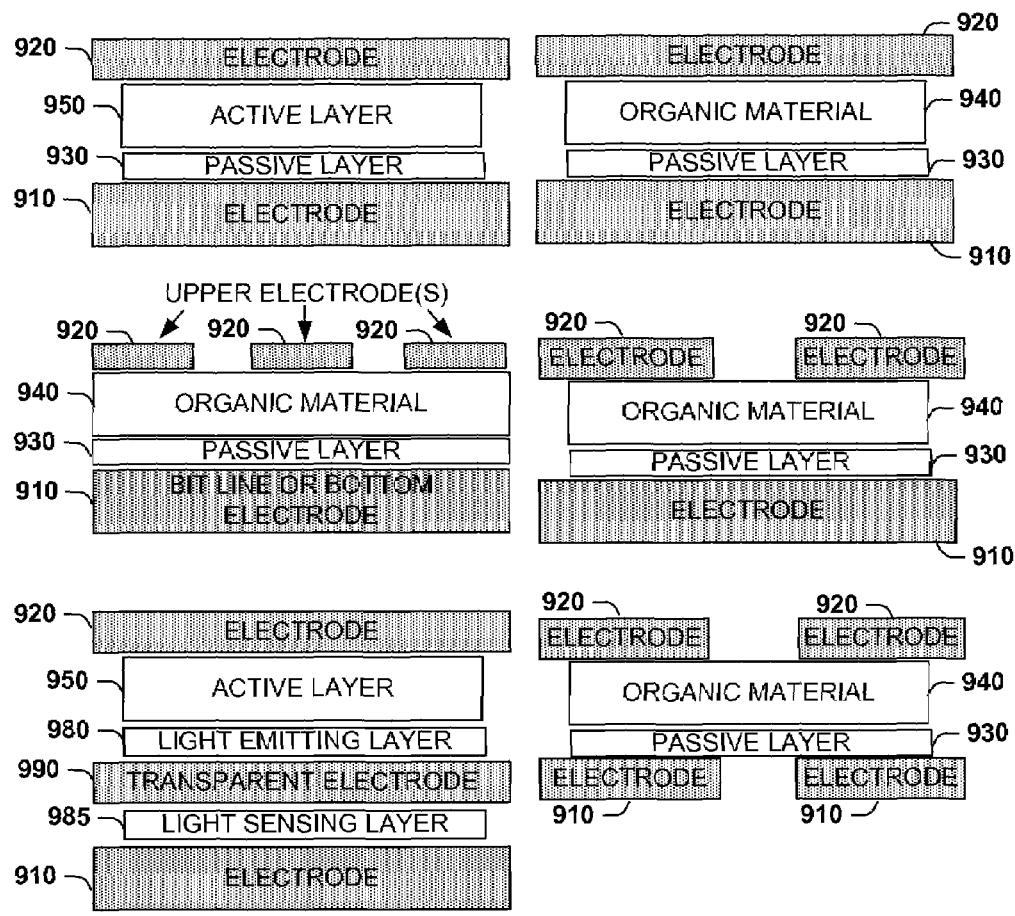
FIG. 9 illustrates various exemplary structures of memory devices in accordance with an aspect of the present invention.

Referring now to FIG. 9 structures of memory cells with various exemplary electrode arrangements and passive/active layers that can exhibit programmable thresholds according to the present invention are illustrated. Typically for such memory cells, upper and lower electrodes sandwich various other active and passive layers, and can exhibit desired programmable thresholds, as described in more detail supra. The electrodes (e.g. 910, 920) can be comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal suicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the electrodes can vary depending on the implementation and the memory device being constructed. However, some exemplary thickness ranges include about 100 nm or more and about 10 um or less for electrodes 910 and 920. The electrodes can be placed in an alternating fashion among various layers of for example semiconductor layers, polymer layers, and passive layers.

As explained supra, the passive layer 930 is operative to transport ions from a bit line or bottom electrode 910 to the interface between the active (e.g., organic) layer 940 and 950 and the passive layer 930. Additionally, the passive layer 930 facilitates ion injection into the active layer 940 and 950 and increases the concentration of the ions in the active layer resulting in a modification of the conductivity of the active layer 940 and 950. In addition, the passive layer 930 can in some instances act as a catalyst when forming the active layer 940 and 950. In this connection, backbone of the conjugated organic molecule may initially form adjacent the passive layer 930, and grow or assemble away and substantially perpendicular to the passive layer surface. As a result, the backbones of the conjugated organic molecule may be self aligned in a direction that traverses the two electrodes. Alternatively, a layer comprising a transparent electrode 990 between a light emitting layer 980 and a light sensing layer 985 can facilitate ion transfer to the active layer 940 and 950 from an electrode 910 much like the passive layer of the other embodiments. The discussion infra describes and illustrates ionic concentration and models behavior of such polymer memory devices.

In the following example, the active layer is conductive polymer with organic material, and $Cu_2S$ is used as passive layer material. It has relatively strong capability to gain electrons from a contacting polymer and yields the following equations:

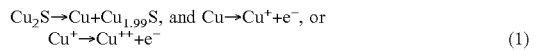

(1)

Figure 10:
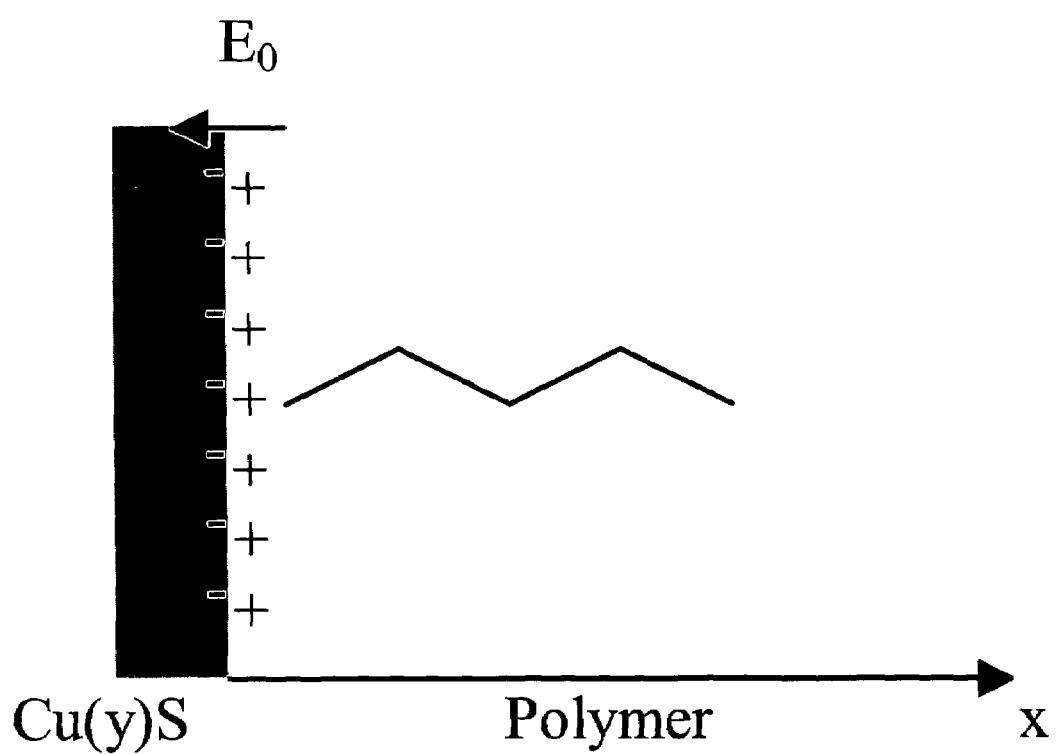
FIG. 10 is a graph depicting the effect of an intrinsic field at the interface between a passive or superionic layer and the polymer layer in accordance with an aspect of the present invention.

The consequence is that an intrinsic field is produced due to the charges accumulated at the double layer between CuS and polymer. This is shown in FIG. 10, which is a graph depicting the effect of an intrinsic electric field on an interface between Cu(y)S (with y accepting a suitable value e.g., from 1 to 2) and a polymer is provided. E represents the electric field, and x indicates the distance of the electric field measured from the interface (thus $E_0$ represents the electric field at the interface). It is to be noted that this figure is a schematic such that no actual units of distance are shown. The oxidized copper ($Cu^+$) is the charge carrier when external field is applied. The conductivity of polymer is determined by its concentration and its mobility.

$$\sigma = qp\mu \qquad (2)$$

Where q is the ionic charge, p is ion concentration and $\mu$ is the mobility.

Figure 11:
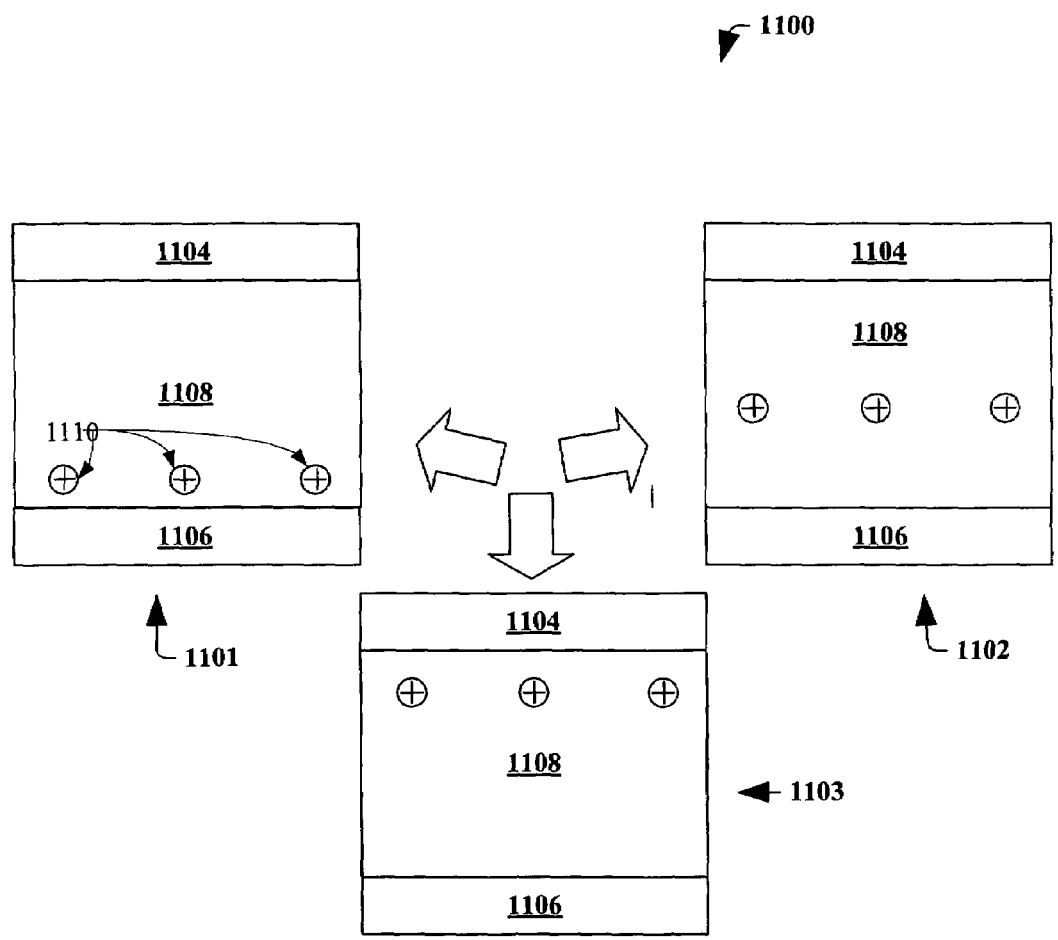
FIG. 11 is a schematic diagram depicting a polymer memory cell in various states according to an aspect of the present invention.

FIG. 11 is a schematic diagram that illustrates a polymer memory device 1100 in various states (1101, 1102 and 1103) in accordance with an aspect of the present invention. The device 1100 is depicted in a first "off" state 1101, an "on" state 1102, and a second "off" state 1103. It is appreciated that memory devices formed in accordance with the present invention can have other states than those depicted in FIG. 11. The polymer memory device 1100 comprises a top electrode 1104, a bottom electrode 1106 and a selectively conductive layer 1108 comprising an active layer (e.g., PPA) and at least one passive layer (e.g., $Cu_2S$). In the first off state 1101, charges (e.g., positive ions) 1110 collect in the selectively conductive layer 1108 near the bottom electrode 1106. In the on state 1102, the charges 1110 are uniformly distributed thereby indicating an on state. In the second off state 1103, the charges collect in the selectively conductive layer 1108 near the top electrode 1104.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A method of setting a programming threshold of a memory device, comprising:
   determining a differential voltage in an erase direction beyond an erase threshold of a memory cell, the differential voltage is linearly determinative of a corresponding programming threshold for a next programming stage, the memory cell operating based upon ionic movement through a passive layer and an active layer thereof;
   setting the programming threshold for the next programming stage based at least in part on the differential voltage; and
   erasing the memory cell by applying the differential voltage plus the erase threshold thereupon.

2. The method of claim 1, further comprising applying a voltage to the active layer to set an impedance state of the memory device, the impedance state representing an information content.

3. The method of claim 1, further comprising comparing a current flowing through the memory device with a predetermined value.

4. The method of claim 1, further comprising setting at least one of a write and erase threshold of the memory cell to a predetermined value.

5. The method of claim 1, differential voltage is determined based at least in part on interpreting a graph that depicts the programming threshold as a function of the differential voltage.

6. The method of claim 5, further comprising varying the programming threshold as a linear function of the differential voltage.

7. A method of setting a programming threshold of a memory device, comprising:
  determining a desired programming threshold for a next programming stage of a polymer memory cell, the polymer memory cell operating based upon ionic movement through a passive layer and an active layer thereof;
  discerning a pulse width that corresponds to the desired programming threshold; and
  setting the programming threshold of the memory cell via the pulse width.

8. The method of claim 7, further comprising balancing a memory speed with power supply voltage to obtain optimum performance in a circuit design.

9. The method of claim 7, the pulse width is based at least in part on analyzing a graph that depicts the programming threshold as a function of pulse width.

10. The method of claim 9, further comprising varying the programming threshold as a hyperbolic function of pulse width.

11. The method of claim 7, setting the programming threshold of the memory cell comprises applying a voltage in the erase direction.

12. The method of claim 11, the voltage applied exceeds an erase threshold by an amount related to the desired programming threshold.

* * * * *